United States Patent
Sato et al.

(10) Patent No.: US 7,623,109 B2
(45) Date of Patent: Nov. 24, 2009

(54) DISPLAY DEVICE

(75) Inventors: Hideo Sato, Hitachi (JP); Shigeyuki Nishitani, Mobara (JP); Toshio Miyazawa, Chiba (JP)

(73) Assignee: Hitachi Displays, Ltd., Chiba-ken (JP)

( * ) Notice: Subject to any disclaimer, the term of this patent is extended or adjusted under 35 U.S.C. 154(b) by 575 days.

(21) Appl. No.: 11/514,841

(22) Filed: Sep. 5, 2006

(65) Prior Publication Data

US 2007/0001985 A1 Jan. 4, 2007

Related U.S. Application Data

(63) Continuation of application No. 10/725,593, filed on Dec. 3, 2003, now Pat. No. 7,123,237.

(30) Foreign Application Priority Data

Dec. 26, 2002 (JP) .............................. 2002-377150

(51) Int. Cl.
G09G 3/36 (2006.01)
(52) U.S. Cl. ................ 345/98; 345/87; 345/92
(58) Field of Classification Search ............. 345/87–88, 345/92–100, 204, 210–214; 327/333
See application file for complete search history.

(56) References Cited

U.S. PATENT DOCUMENTS

| 5,748,026 A | 5/1998 | Maekawa et al. |
| 6,107,857 A * | 8/2000 | Orisaka et al. ............... 327/333 |
| 7,006,068 B2 | 2/2006 | Haga |

2002/0097212 A1 7/2002 Miyazawa et al.

FOREIGN PATENT DOCUMENTS

| JP | 10-303732 | 4/1997 |
| JP | 2002-251174 | 11/2001 |

OTHER PUBLICATIONS

Hiroshi Haga, Hiroshi Tsuchi, Katsumi Abe, Naoyasu Ikeda, Hideki Asada, Hiroshi Hayama, Kunihiro Shiota and Naruaki Takada, "A Parallel Digital-Data-Driver Architecture for Low-Power Poly-Si TFT-LCDs", SID 02 Digest (2002), pp. 690-693.

* cited by examiner

*Primary Examiner*—Richard Hjerpe
*Assistant Examiner*—Mansour M Said
(74) *Attorney, Agent, or Firm*—Stites & Harbison PLLC; Juan Carlos A. Marquez, Esq.

(57) ABSTRACT

The present invention provides a display device which is capable of fetching input signals of a small amplitude into the inside thereof. A level converting circuit includes a first-conductive-type first transistor having a gate electrode to which input signals are applied through a first capacitive element, a second-conductive-type second transistor having a gate electrode to which input signals are applied through a second capacitive element, a first bias circuit which applies a first bias voltage to the gate electrode of the first transistor and a second bias circuit which applies a second bias voltage to the gate electrode of the second transistor. Here, the first bias voltage is a voltage which turns off the first transistor when a voltage applied to the gate electrode of the first transistor assumes a maximum value and the second bias voltage is a voltage which turns off the second transistor when a voltage applied to the gate electrode of the second transistor assumes a minimum value.

6 Claims, 10 Drawing Sheets

DISPLAY DEVICE

CROSS-REFERENCE TO RELATED APPLICATION

This application is a continuation application of U.S. application Ser. No. 10/725,593 filed Dec. 3, 2003 now U.S. Pat. No. 7,123,237. Priority is claimed based on U.S. application Ser. No. 10/725,593 field Dec. 3, 2003, which claims the priority of Japanese Patent Application No. 2002-377150 filed on Dec. 26, 2002, all of which is incorporated by reference.

BACKGROUND OF THE INVENTION

The present invention relates to a display device, and more particularly to a display device provided with a level converting circuit which converts a voltage level of input signals (control signal, display data, for example) having a small amplitude inputted from outside.

A TFT (thin film transistor) type liquid crystal display module has been popularly used as a display device of a notebook type personal computer or the like.

In this liquid crystal display module, in response to input signals (for example, display date, control signals) which are inputted from an outside (for example, a host-side computer), images are displayed. In such a case, in general, a level converting circuit which converts the input signals into signals having larger amplitudes is provided to an input stage of the liquid crystal display module.

As this level converting circuit, a capacitive coupling type level converting circuit (see Japanese Unexamined Patent Publication 2002/251174, hereinafter referred to as "patent literature 1") or a direct-coupled type level converting circuit (see SID 02 DIGEST pp. 690-693, hereinafter referred to as "non-patent literature 1") has been known.

SUMMARY OF THE INVENTION

However, in the related art, as non-differential input signals which are inputted to the level converting circuit which is incorporated into a substrate as a peripheral circuit and uses thin film transistors, signals having an amplitude of approximately 3V which is sufficiently large compared to a threshold voltage of the thin film transistors (about 0.7V in general) are used and a case in which the input signals assume a lower amplitude has not been taken into consideration.

In the capacitive coupling type level converting circuit described in the above-mentioned patent literature 1, as can be clearly understood from paragraphs [0038] to [0059] of the patent literature 1 and the description of FIG. 1 in the patent literature 1, as non-differential input signals VIN, signals having a high amplitude which is more than twice as high as an amplitude of a threshold voltage of the thin film transistors are necessary and hence, the input signals having an amplitude smaller than the twofold value of the threshold voltage cannot be subjected to level conversion.

Further, in the capacitive coupling type level conversion circuit, when a duty ratio of input signals is changed, the initializing becomes necessary and hence, there arises a drawback that it is difficult to perform the level conversion with respect to signals such as display data which changes a duty ratio thereof vigorously.

Further, with respect to the direct-coupled type level converting circuit described in the above-mentioned non-patent literature 1, as can be clearly understood from the circuit constitution shown in FIG. 2 of the non-patent literature 1, the level converting circuit adopts an amplifying circuit in which a source electrode of a thin film transistor which constitutes a V/I conversion circuit is connected to a reference potential (GND). Accordingly, although there exists no problem when an amplitude of input signals is input signals having a 3V amplitude estimated by the non-patent literature 1, the level conversion cannot be performed with a sufficient response speed when the input signals assume an amplitude lower than the 3V amplitude. Further, when an amplitude of the input signals is equal to or below a threshold voltage, the level conversion cannot be performed.

Accordingly, with respect to the conventional level conversion circuits described in the patent literature 1, the non-patent literature 1 and the like, when the non-differential input signals are used, to take the fluctuation of the threshold voltage attributed to manufacturing irregularities of thin film transistors and a practical response speed into consideration, it is difficult to use input signals having a small amplitude (for example, an amplitude equal to or less than 1.2V).

The present inventions have been made in view of such a background and it is an advantage of the present invention that the present invention can provide a display device which is capable of performing the level conversion of input signals having a small amplitude.

The above-mentioned and other advantages and novel features of the present invention will become apparent from the description of this specification and attached drawings.

To briefly explain typical inventions among the inventions disclosed in the specification, they are as follows.

In the present invention, for performing the level conversion of control signals having small fluctuation of a duty ratio (for example, at least one of clock signals, horizontal synchronous signals, vertical synchronous signals, sampling signals and the like), a capacitive coupling type level converting circuit is used.

The capacitive coupling type level converting circuit of the present invention differs from the level converting circuit described in the previously-mentioned patent literature 1 in the circuit constitution with respect to a point that the capacitive coupling type level converting circuit of the present invention includes a first bias circuit which applies a bias voltage to a gate electrode of a first transistor and a second bias circuit which applies a bias voltage to a gate electrode of a second transistor.

In the present invention, when a voltage applied to the gate electrode of the first transistor assumes a maximum value, the first bias circuit applies a voltage which turns off the first transistor (for example, a voltage which allows the maximum value of a voltage applied to the gate electrode of the first transistor to assume a voltage value which is obtained by subtracting a threshold value of the first transistor from a first voltage (Vdd)) to the gate electrode of the first transistor.

Further, when a voltage applied to the gate electrode of the second transistor assumes a minimum value, the second bias circuit applies a voltage which turns off the second transistor (for example, a voltage which allows the minimum value of a voltage applied to the gate electrode of the second transistor to assume a voltage value which is obtained by adding a threshold value of the second transistor to a second voltage (GND) to the gate electrode of the second transistor.

That is, according to the present invention, in the first and the second bias circuits, the gate voltages of the first transistor and the second transistor are biased to voltages substantially equal to the threshold voltages, and when the voltage of input signals assumes either High level (hereinafter simply referred to as "H level") or Low level (hereinafter simply referred to as "L level"), the voltage to which the threshold value and the voltage amplitude of the input signals are added is applied to the gate voltage of either one of the transistors. Accordingly, even when the amplitude of the input signals is low, it is possible to perform the level conversion at a sufficiently high speed.

Further, in the present invention, for performing the level conversion of the display data having a duty ratio which largely fluctuates, a direct-coupled type level converting circuit adopting sampling & level conversion is used.

The direct-coupled type level converting circuit differs from the level converting circuit described in the previously-mentioned non-patent literature 1 in the circuit constitution with respect to a point that the direct-coupled type level converting circuit includes a bias circuit which applies a bias voltage to a second electrode (source electrode) of a transistor having a source ground which constitutes a V/I converting circuit.

In the bias circuit of the present invention, when a voltage applied to the gate electrode of the transistor assumes a minimum value, the bias circuit applies a voltage which turns off the transistor (for example, a voltage which is obtained by subtracting a threshold voltage of the transistor from a second voltage (GND)) to the second electrode of the transistor.

Due to such a constitution, it is possible to obtain a high ON/OFF current ratio of the transistor and hence, even when the amplitude of the input signals is low, it is possible to perform the level conversion with a sufficient response.

DESCRIPTION OF THE PREFERRED EMBODIMENTS

Hereinafter, preferred embodiments of the present invention are explained in detail in conjunction with attached drawings.

Here, in all drawings which are served for explaining the embodiments, parts having the same functions are indicated by same symbols and their repeated explanation is omitted.

Figure 1:
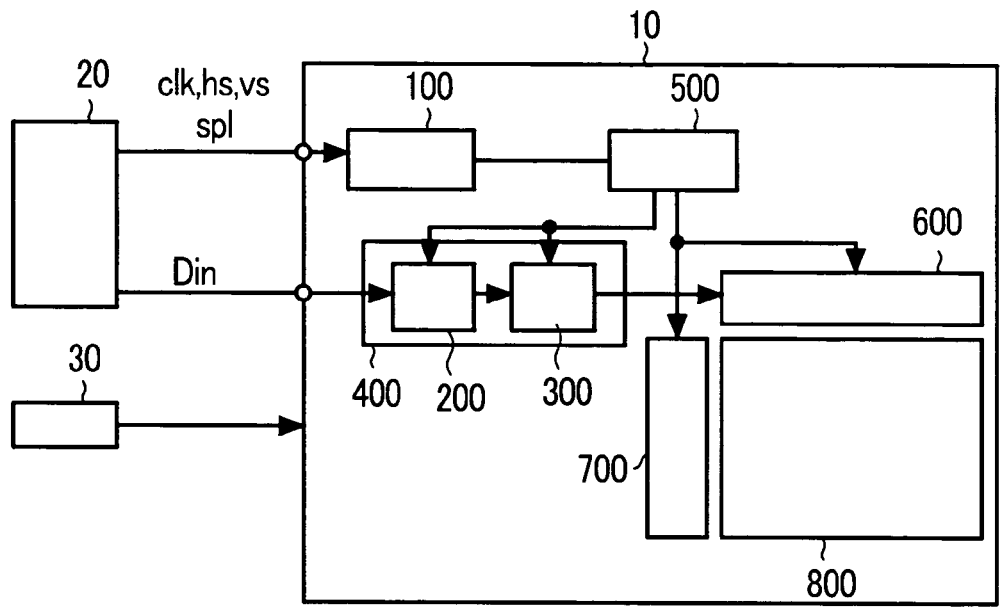
FIG. 1 is a block diagram showing the schematic constitution of a display device of an embodiment of the present invention.

FIG. 1 is a block diagram showing the schematic constitution of a display device according to an embodiment of the present invention.

The display device of this embodiment is a liquid crystal display device using low-temperature polysilicon TFTs (thin film transistors) (hereinafter referred to as "TFT-LCD) which is, for example, constituted of a low-temperature polysilicon substrate 10 which forms thin film transistors on an insulation substrate made of glass, plastic or the like (hereinafter referred to as "LTPS substrate"), a system LSI 20 arranged in the inside of the host-side computer and a power source circuit 30.

On the LTPS substrate 10, a capacitive coupling type level converting circuit 100, a sample holding circuit 200, a direct-coupled type level converting circuit 300, a serial-parallel converting circuit 400, a timing control circuit 500, a drain line drive circuit 600, a gate line drive circuit 700, and a display part 800 are formed.

As transistors used in these circuits which are formed on the LTPS substrate 10, TFTs are used.

Further, in the display part 800, a plurality of pixels which include TFTs and are arranged in a matrix array, drain signal lines which supply a video signal voltage to respective pixels, gate signal lines which supply a scanning signal voltage to respective pixels and the like are formed. Since these constitutions are well known, they are omitted from the drawing.

Among these circuits formed on the LTPS substrate 10, the circuits other than the display part 800 are referred to as peripheral circuits.

Here, in FIG. 1, symbol clk indicates a clock signal, symbol hs indicates a horizontal synchronous signal, symbol vs indicates a vertical synchronous signal, symbol spl indicates a sampling signal and symbol Din indicates display data.

In this embodiment, for example, a capacitive coupling type level converting circuit 100 is used with respect to control signals such as the clock signal (clk), the horizontal synchronous signal (hs), the vertical synchronous signal (vs) and the sampling signal (spl), while a direct-coupled type level converting circuit is used with respect to the display data (Din).

As one of the control signals, a display timing signal (DTMG) not shown in the drawing may be used. Types of control signals used are suitably selected depending on the usage or the application.

A duty ratio of control signals is substantially fixed and does not change and hence, the fluctuation of a bias point is small also with respect to the capacitive coupling type level converting circuit 10 and the jitter of converted signals can be reduced.

The inputted control signals having a small amplitude are converted into signals having a larger amplitude by level conversion performed by the capacitive coupling type lever converting circuit 100 and, thereafter, the converted signals are inputted to the timing control circuit 500.

In the timing control circuit 500, the sample holding circuit 200, the direct-coupled type level converting circuit 300, the drain line drive circuit 600 and the gate line drive circuit 700 are controlled in response to these signals.

With respect to the display data (Din), using the sample holding circuit 200 and the direct-coupled type level converting circuit 300, the display data are temporarily subjected to sample holding and, thereafter, the display data are subjected to level conversion.

Here, a plurality of sample holding circuits 200 and a plurality of direct-coupled type level converting circuits are arranged in parallel in the serial-parallel converting circuit 400, wherein the display data which are inputted in series are sampled by shifting the timing using the sample holding circuits 200 which are arranged in parallel respectively and the level conversion of the display data is performed using the corresponding direct-coupled type level converting circuits 300.

Accordingly, the sufficiently long processing time in respective level converting circuits can be ensured and hence, it is possible to cope with inputting of the more rapid display data. As a result, the number of terminals for inputting the display data can be decreased so that highly reliable display device can be realized.

Here, sampling pulses which are necessary in the sample holding circuit 200 and signals which are necessary for the control of the direct-coupled type level converting circuit 300 are supplied from the timing control circuit 500.

In this manner, this embodiment uses the different level conversions, wherein the control signals are subjected to the level conversion using the capacitive coupling type level converting circuit 100 which is capable of performing the rapid operation and, thereafter, by making use of the signals obtained by the capacitive coupling type level converting circuit 100, the display data is subject to the level conversion using the direct-coupled type level converting circuit 300.

Further, since the voltage, the control signals and the display data of the system LSI (20) can be controlled to low voltages, the power consumption of the display device can be reduced.

Figure 2:
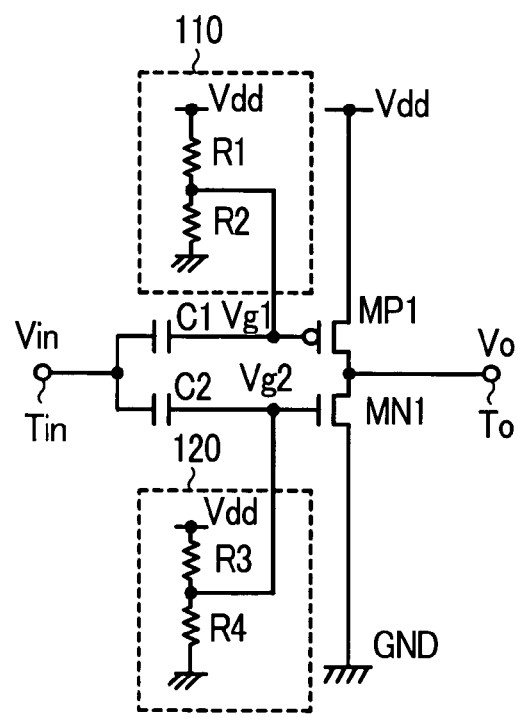
FIG. 2 is a circuit diagram showing the circuit constitution of one example of a capacitive coupling type level converting circuit shown in FIG. 1.

FIG. 2 is a circuit diagram showing the circuit constitution of one example of the capacitive coupling type level converting circuit 100 shown in FIG. 1.

The capacitive coupling type level converting circuit 100 shown in FIG. 2 is constituted by a P type MOS transistor (hereinafter, simply referred to as "PMOS") (MP1), an N type MOS transistor (hereinafter, simply referred to as "NMOS") (MN1), capacitive elements (C1, C2), a first bias circuit 110 and a second bias circuit 120.

A source electrode (hereinafter, simply referred to as "source") and a drain electrode (hereinafter, simply referred to as "drain") of the PMOS (MP1) are connected to a power source line to which a power source voltage (Vdd) is supplied and an output terminal (To) respectively, while a gate electrode (hereinafter simply referred to as "gate") is connected to a first bias circuit 110 and the capacitive element (C1).

A source and a drain of the NMOS (MN1) are connected to a ground line to which a ground voltage (GND) is supplied and the output terminal (To) respectively, while a gate of the NMOS (MN1) is connected to a second bias circuit 120 and the capacitive element (C2).

Another ends of the capacitive elements (C1, C2) are connected to an input terminal (Tin).

Both of the first bias circuit 110 and the second bias circuit 120 are constituted by a resistance potential dividing circuit and are constituted by resistance elements (R1, R2) and resistance elements (R3, R4) respectively.

Figure 3:
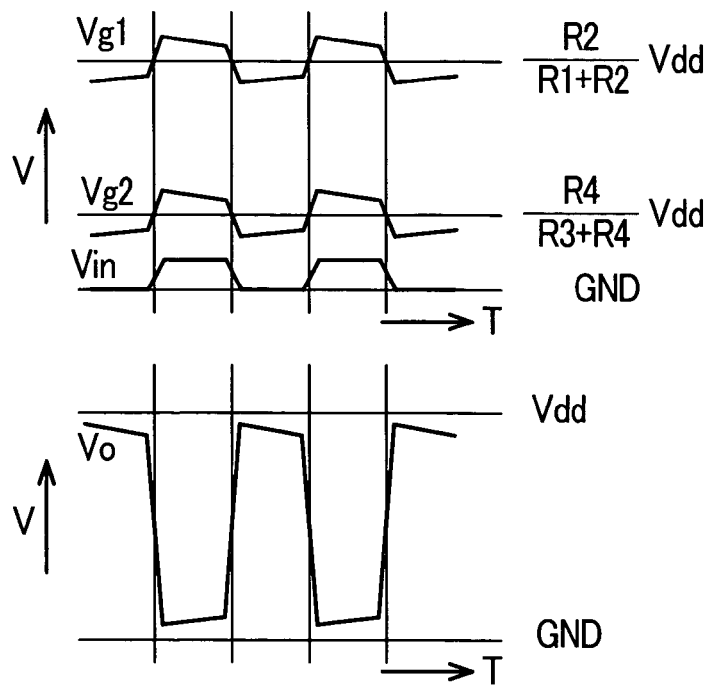
FIG. 3 is a view showing operational waveforms of the capacitive coupling type level converting circuit shown in FIG. 2.

FIG. 3 is a view showing operational waveforms of the capacitive coupling type level converting circuit 100 shown in FIG. 2 and shows voltage waveforms of respective gate voltages (Vg1, Vg2) of the PMOS (MP1) and the NMOS (MN1), the input voltage (Vin) and the output voltage (Vo).

Here, T indicates time and V indicates voltage in FIG. 3 and in FIG. 5, FIG. 7 and FIG. 9 which will be explained later.

The gate voltage (Vg1) and the gate voltage (Vg2) have the same phase as the input voltage (Vin) and the center voltages of these voltages are the voltages which are obtained by dividing the power source voltage (Vdd) with respective resistances.

In the first bias circuit 110, a bias voltage is set such that a maximum value of the voltage (Vg1) which is applied to the gate of the PMOS (MP1) becomes a voltage (Vdd−Vthp) which is obtained by subtracting a threshold voltage (Vthp) of the PMOS (MP1) from the power source voltage (Vdd).

Due to such setting, the gate voltage (Vg1) assumes a voltage corresponding to the threshold voltage (Vthp) of the transistor (MP1) and a voltage which is lower than the threshold voltage (Vthp) by an amount corresponding to an amplitude of the input voltage (Vin) and hence, the PMOS (MP1) is turned on/off based on these voltages.

Similarly, in the second bias circuit 120, the bias voltage is set such that the minimum value of the voltage which is applied to the gate of the NMOS (NM1) assumes a voltage (GND+Vthn=Vthn) which is obtained by adding the threshold voltage (Vthn) of the NMOS (MN1) to a ground voltage (GND).

By this setting or voltages, the gate voltage (Vg2) assumes a voltage corresponding to the threshold voltage (Vthn) and a voltage which is higher than the threshold voltage (Vthn) by an amount corresponding to the amplitude of the input voltage (Vin) and hence, the NMOS (MN1) is turned on/off based on these voltages.

Here, since the PMOS (MP1) and the NMOS (MN1) operate complementarily, the output voltage (Vo), the amplitude thereof has the reversed phase with respect the input voltage (Vin) and can set an amplitude thereof substantially equal to the amplitude of the power source voltage (Vdd).

In the capacitive coupling type level converting circuit shown in FIG. 2, as shown in FIG. 3, waveform distortions referred to as sagging are generated in the waveforms of the gate voltages (Vg1, Vg2).

These waveform distortions are related to respective products (time constants) of capacitive elements (C1, C2) for coupling and the output resistances of the first and the second bias circuits (110, 120), wherein when the time constant is large, the waveform distortion is small and the time constant is small, the waveform distortion is large. Therefore, by setting the large time constant, the waveform distortion can be reduced.

However, when the time constant is increased, the time needed for stabilizing the gate voltages (Vg1, Vg2) is prolonged. This arises problems at the time of supplying electricity.

Figure 4:
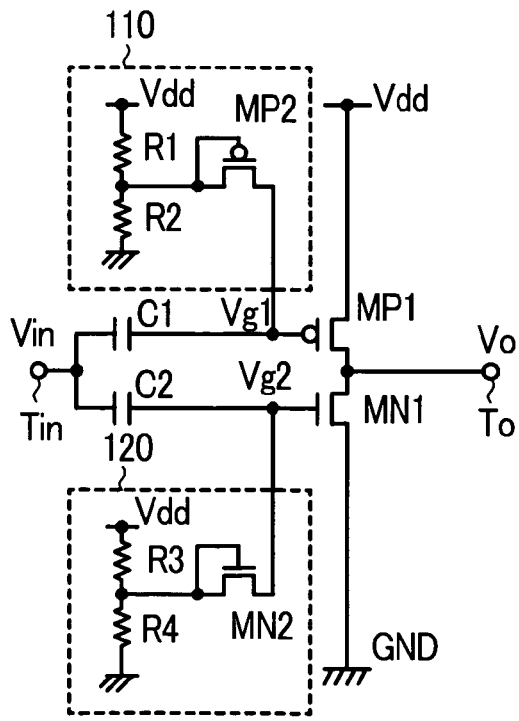
FIG. 4 is a circuit diagram showing the circuit constitution of another example of a capacitive coupling type level converting circuit shown in FIG. 1.

FIG. 4 is a circuit diagram showing a circuit constitution of another example of the capacitive coupling type level converting circuit 100 shown in FIG. 1.

The capacitive coupling type level converting circuit shown in FIG. 4 differs from the capacitive coupling type level converting circuit 100 shown in FIG. 2 in that the first bias circuit 110 is connected to a diode-connected PMOS (MP2) and the second bias circuit 120 is connected to a diode-connected NMOS (MN2).

Figure 5:
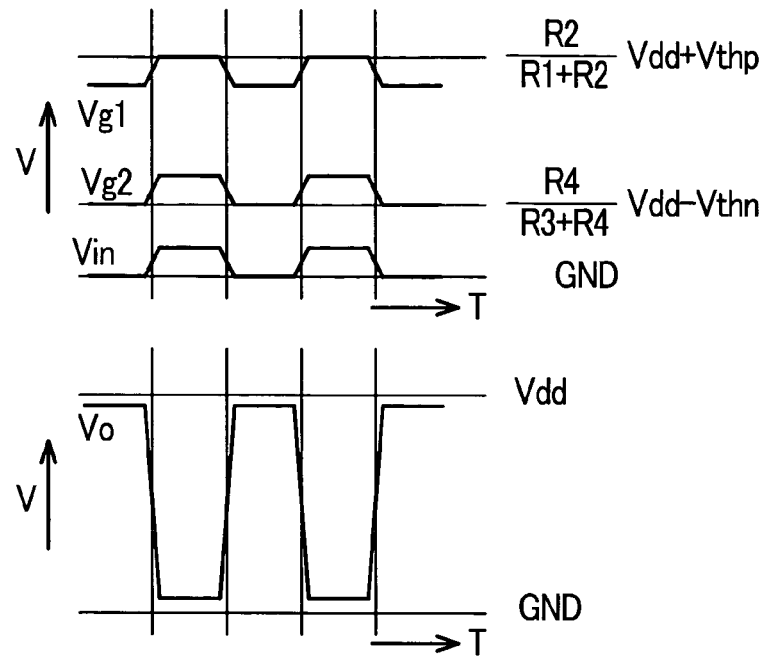
FIG. 5 is a view showing operational waveforms of the capacitive coupling type level converting circuit shown in FIG. 4.

FIG. 5 is a view showing operational waveforms of the capacitive coupling type level converting circuit shown in FIG. 4 and shows voltage waveforms of respective gate voltages (Vg1, Vg2) of the PMOS (MP1) and the NMOS (MN1) and the input voltage (Vin) and the output voltage (Vo).

The maximum value of the voltage applied to the gate of the PMOS (MP1) is controlled by the PMOS (MP2) which is connected in diode connection such that the maximum value of the voltage assumes a voltage which is higher than a voltage obtained by voltage dividing using the resistance element (R1) and the resistance element (R2) by an amount of a threshold voltage (Vthp) of the PMOS (MP2). On the other hand, the minimum value of the voltage applied to the gate of the PMOS (MP1) is controlled to a voltage which is lower than the maximum value by an amplitude of the input voltage (Vin).

The threshold voltages of respective PMOS substantially agree to each other and hence, by setting the voltage which is divided by the resistance element (R1) and the resistance element (R2) to a voltage which is lower than the power source voltage (Vdd) by only an amount which is a twofold value of the threshold voltage (Vthp) of the PMOS (MP2), the maximum value of the voltage (Vg1) which is applied to the gate of the PMOS (MP1) can be set to a voltage (Vdd−Vthp) obtained by subtracting the threshold voltage (Vthp) of PMOS (MP1) from the power source voltage (Vdd).

On the other hand, the minimum value of the voltage applied to the gate of the NMOS (MN1) is controlled by the NMOS (MN2) which is connected in diode connection such that the minimum value of the voltage assumes a voltage which is lower than a voltage obtained by voltage dividing using the resistance element (R3) and the resistance element (R4) by an amount of a threshold voltage (Vthn) of the NMOS (MN2). On the other hand, the maximum value of the voltage applied to the gate of the NMOS (MN1) is controlled to a voltage which is higher than the minimum value by the amplitude of the input voltage (Vin).

The threshold voltages of respective NMOS substantially agree to each other and hence, by setting the voltage which is divided by the resistance element (R3) and the resistance element (R4) to a voltage which is a twofold value of the threshold voltage (Vthn) of the NMOS (MN2), the minimum value of the voltage which is applied to the gate of the NMOS (MN1) can be set to the voltage higher than the ground voltage (GND) by the threshold voltage (Vthn) of the NMOS (MN2).

Due to such setting of voltages, the gate voltage (Vg1) and the gate voltage (Vg2) become substantially equal to the corresponding voltages of the capacitive coupling type level converting circuit shown in FIG. 2 and the amplitude of the input voltage (Vin) can be converted into the amplitude which is the difference between the power source voltage (Vdd) and the ground voltage (GND).

Further, in the capacitive coupling type level converting circuit 100, by means of the diode-connected MOS transistors (MP2, MN2), the maximum value of the gate voltage (Vg1) and the minimum value of the gate voltage (Vg2) are biased so that these values can assume constant voltages.

Accordingly, in the gate voltages (Vg1, Vg2), no waveform distortion which is shown in FIG. 3, for example, is generated and hence, in the capacitive coupling type level converting circuit shown in FIG. 4, the high speed level converting circuit with small jitter can be realized.

Figure 6:
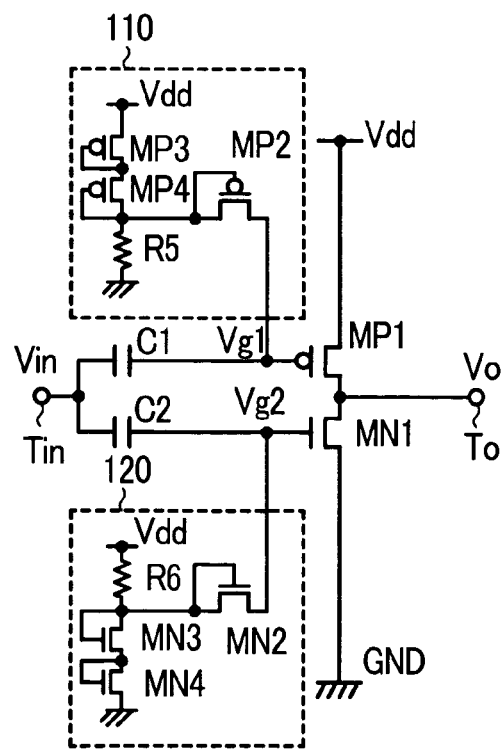
FIG. 6 is a circuit diagram showing the circuit constitution of another example of a capacitive coupling type level converting circuit shown in FIG. 1.

FIG. 6 is a circuit diagram showing a circuit constitution of another example of the capacitive coupling type level converting circuit 100 shown in FIG. 1.

The capacitive coupling type level converting circuit shown in FIG. 6 differs from the capacitive coupling type level converting circuit shown in FIG. 4 in the circuit constitutions of the first bias circuit 110 and the second bias circuit 120.

Figure 7:
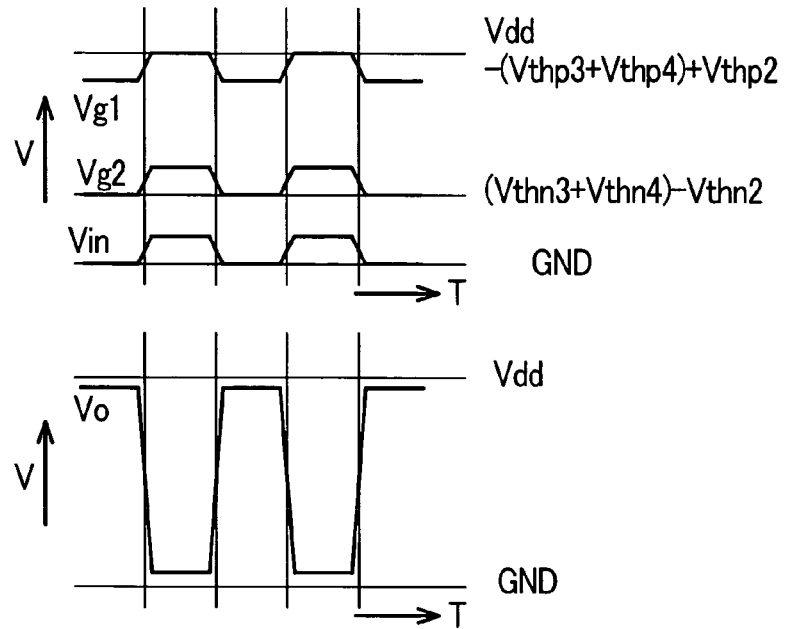
FIG. 7 is a view showing operational waveforms of the capacitive coupling type level converting circuit shown in FIG. 6.

FIG. 7 is a view showing operational waveforms of the capacitive coupling type level converting circuit shown in FIG. 6 and shows voltage waveforms of respective gate voltages (Vg1, Vg2) of the PMOS (MP1) and the NMOS (MN1) and the input voltage (Vin) and the output voltage (Vo).

In the capacitive coupling type level converting circuit shown in FIG. 6, the first bias circuit 110 is constituted by three diode-connected PMOS (MP2, MP3, MP4) and a resistance element (R5).

The PMOS (MP3), the PMOS (MP4) and the resistance element (R5) are connected in series between the power source voltage (Vdd) and the ground voltage (GND) and the PMOS (MP2) is connected between the drain of the PMOS (MP4) and the gate of the PMOS (MP1).

Due to such a circuit constitution, the voltage which is applied to the PMOS (MP2) becomes Vdd−(Vthp3+Vthp4).

Accordingly, a maximum value (Vg1max) of the gate voltage (Vg1) which is applied to the gate of the PMOS (MP1) is expressed by the following formula (1).

$$Vg1\mathrm{max}=Vdd-(Vthp3+Vthp4)+Vthp2 \quad (1)$$

Here, the threshold voltages of the respective PMOS substantially agree to each other and hence, the maximum value (Vg1max) of the gate voltage (Vg1) is set to (Vdd−Vthp).

Similarly, the second bias circuit 120 is constituted by three diode-connected NMOS (MN2, MN3, MN4) and a resistance element (R6).

The NMOS (MN3), the NMOS (MN4) and the resistance element (R6) are connected in series between the power source voltage (Vdd) and the ground voltage (GND) and the NMOS (MN2) is connected between the drain of the NMOS (MN3) and the gate of the NMOS (MN1).

Due to such a circuit constitution, the voltage which is applied to the NMOS (MN2) becomes (Vthn3+Vthn4).

Accordingly, a minimum value (Vg2max) of the gate voltage (Vg2) which is applied to the gate of the NMOS (MN1) is expressed by the following formula (2).

$$Vg2\mathrm{min}=(Vthn3+Vthn4)-Vthn2 \quad (2)$$

Here, the threshold voltages of the respective NMOS substantially agree to each other and hence, the minimum value (Vg2min) of the gate voltage (Vg2) is controlled by Vthn.

In this manner, also in the capacitive coupling type level converting circuit shown in FIG. 6, the maximum value of the gate voltage (Vg1) and the minimum value of the gate voltage (Vg2) can be set as in the case with the capacitive coupling type level converting circuit shown in FIG. 4 and hence, also in the capacitive coupling type level converting circuit shown in FIG. 6, the high-speed level converting circuit with small jitter can be realized.

Further, in the capacitive coupling type level converting circuit shown in FIG. 6, since the maximum value of the gate voltage (Vg1) and the minimum value of the gate voltage (Vg2) do not depend on the resistance elements (R5, R6), the adjustment which is made when the threshold voltage (Vth) of the MOS transistor is fluctuated becomes no more necessary.

Figure 8:
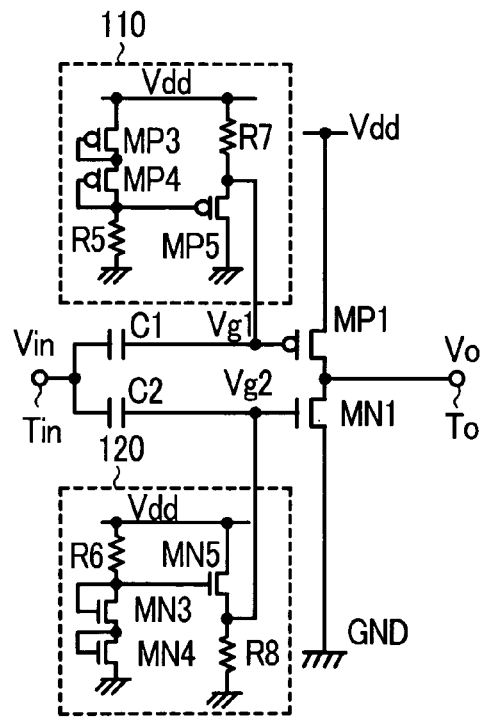
FIG. 8 is a circuit diagram showing the circuit constitution of another example of a capacitive coupling type level converting circuit shown in FIG. 1.

FIG. 8 is a circuit diagram showing a circuit constitution of another example of the capacitive coupling type level converting circuit 100 shown in FIG. 1.

The capacitive coupling type level converting circuit shown in FIG. 8 differs from the capacitive coupling type level converting circuit shown in FIG. 6 in that the PMOS (MP5) and a resistance element (R7) are used instead of the PMOS (MP2) of the first bias circuit 110, while the NMOS (MN5) and a resistance element (R8) are used instead of the NMOS (MN2) of the second bias circuit 120.

Here, the gate of the PMOS (MP5) is connected to the drain of the PMOS (MP4) and the PMOS (MP5) and the resistance element (R7) constitute a source follower circuit.

When the PMOS (MP5) receives a forward bias, the voltage between the gate and the source of the PMOS (MP5) become Vthp5 and when the PMOS (MP5) receive a reverse bias, the PMOS (MP5) assumes the OFF state.

Due to such setting of voltages, a maximum value (Vg1max) of the gate voltage (Vg1) is expressed by the following formula (3).

$$Vg1max = Vdd - (Vthp3 + Vthp4) + Vthp5 \quad (3)$$

Here, the threshold voltages of the respective PMOS substantially agree to each other and hence, the maximum value (Vg1max) of the gate voltage (Vg1) is set to (Vdd−Vthp).

Similarly, the gate of the NMOS (MN5) is connected to the drain of the NMOS (MN3) and the NMOS (MN5) and a resistance element (R8) constitute a source follower circuit.

When the NMOS (MN5) receives a forward bias, the voltage between the gate and the sources of NMOS (MN5) becomes Vthn5 and when the NMOS (MN5) receives a reverse bias, the NMOS (MN5) assumes the OFF state.

Due to such setting of voltages, a minimum value (Vg2min) of the gate voltage (Vg2) is expressed by the following formula (4).

$$Vg2min = (Vthn3 + Vthn4) - Vthn5 \quad (4)$$

Here, the threshold voltages of the respective NMOS substantially agree to each other and hence, the minimum value (Vg2min) of the gate voltage (Vg2) is controlled in response to the threshold voltage Vthn.

In this manner, also in the capacitive coupling type level converting circuit shown in FIG. 8, the maximum value of the gate voltage (Vg1) and the minimum value of the gate voltage (Vg2) can be set as in the case with the capacitive coupling type level converting circuit shown in FIG. 6. Accordingly, also in the capacitive coupling type level converting circuit shown in FIG. 8, the advantageous effects similar to those of the capacitive coupling type level converting circuit shown in FIG. 6 can be obtained.

Figure 9:
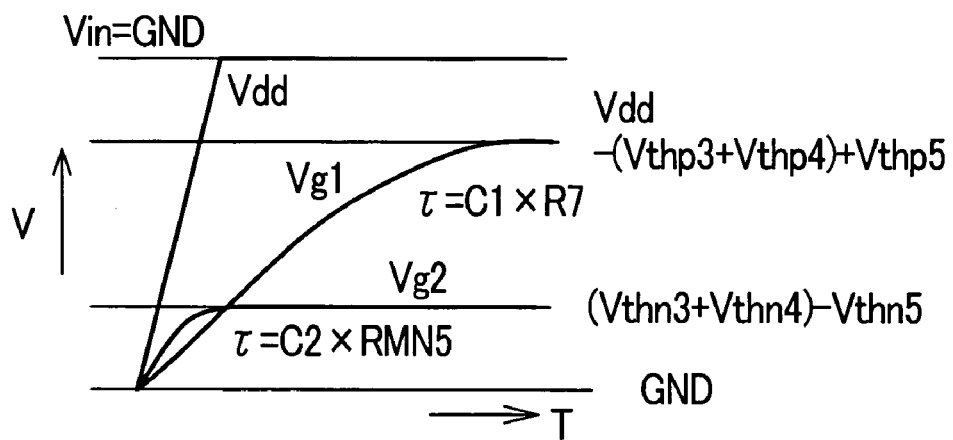
FIG. 9 is a view showing a voltage response of a gate voltage (Vg1) and a gate voltage (Vg2) at the time of supplying electricity in the capacitive coupling type level converting circuit shown in FIG. 8.

FIG. 9 is a view showing the voltage response of the gate voltage (Vg1) and the gate voltage (Vg2) at the time of supplying electricity in the capacitive coupling type level converting circuit shown in FIG. 8.

When an initial value of the inter-terminal voltage of the capacitive element (C1, C2) is set at 0V, the PMOS (MP5) assumes the OFF state and the NMOS (MN5) assumes the ON state.

Accordingly, the response time constant of the gate voltage (Vg1) is expressed by a product of the resistance element (R7) and the capacitive element (C1) and the response time constant of the gate voltage (Vg2) is expressed by a product of a dynamic resistance (RMN5) of the NMOS (MN5) and the capacitive element (C2).

Although the response of the gate voltage (Vg1) is slow and the response of the gate voltage (Vg2) is rapid, by miniaturizing the resistance element (R7), the response time at the time of supplying electricity can be shortened.

Figure 10:
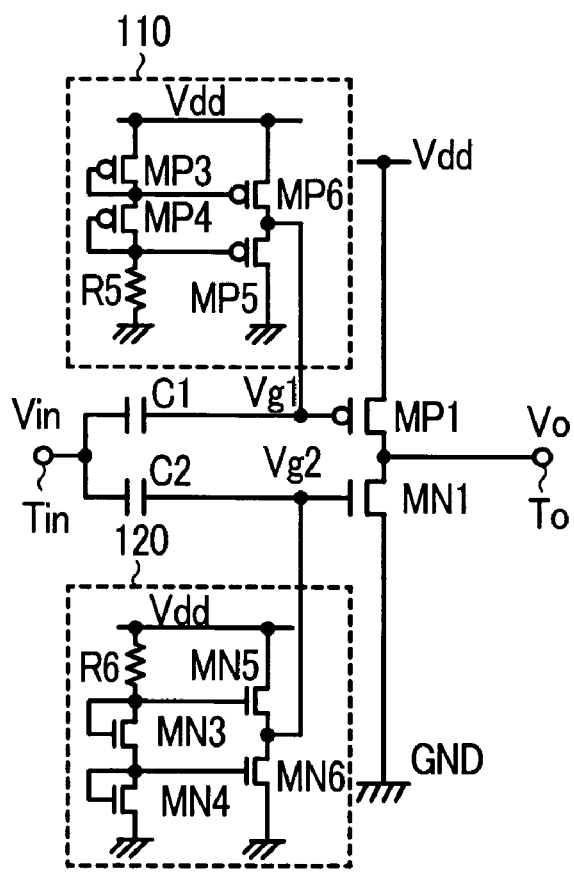
FIG. 10 is a circuit diagram showing the circuit constitution of another example of the capacitive coupling type level converting circuit shown in FIG. 1.

FIG. 10 is a circuit diagram showing a circuit constitution of another example of the capacitive coupling type level converting circuit 100 shown in FIG. 1.

The capacitive coupling type level converting circuit shown in FIG. 10 differs from the capacitive coupling type level converting circuit shown in FIG. 8 in that a PMOS (MP6) is used instead of the resistance element (R7) of the first bias circuit 110 shown in FIG. 8, while an NMOS (MN6) is used instead of the resistance element (R8) of the second bias circuit 120 shown in FIG. 8.

The PMOS (MP6) and the PMOS (MP3) constitute a current mirror circuit and bias the PMOS (MP5) with the constant current and similarly, the NMOS (MN6) and the NMOS (MN4) constitute a current mirror circuit and bias the NMOS (MN5) with the constant current.

Also in the capacitive coupling type level converting circuit shown in FIG. 10, the maximum value of the gate voltage (Vg1) and the minimum value of the gate voltage (Vg2) can be set as in the case with the capacitive coupling type level converting circuit shown in FIG. 8 and hence, also in the capacitive coupling type level converting circuit shown in FIG. 10, advantageous effects similar to those of the capacitive coupling type level converting circuit shown in FIG. 8 can be obtained.

Figure 11:
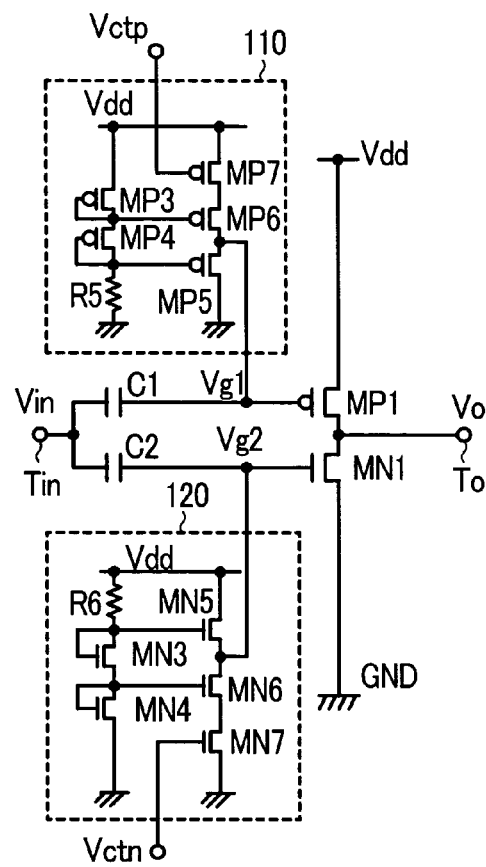
FIG. 11 is a circuit diagram showing the circuit constitution of another example of the capacitive coupling type level converting circuit shown in FIG. 1.

FIG. 11 is a circuit diagram showing a circuit constitution of another example of the capacitive coupling type level converting circuit 100 shown in FIG. 1.

The capacitive coupling type level converting circuit shown in FIG. 11 differs from the capacitive coupling type level converting circuit shown in FIG. 10 in that a PMOS (MP7) is added to the first bias circuit 110 and an NMOS (MN7) is added to the second bias circuit 120.

In the capacitive coupling type level converting circuit shown in FIG. 11, the control signal of Vctp is applied to the gate of the PMOS (MP7) and the control signal of Vctn is applied to the gate of the NMOS (MN7). In response to these control signals (Vctp, Vctn), at the time of supplying electricity, the PMOS (MP7) and the NMOS (MN7) are made to assume an ON state and, in other time, the PMOS (MP7) and the NMOS (MN7) are made to assume an OFF state.

Due to such setting of voltages, the response of the gate voltages (Vg1, Vg2) at the time of supplying electricity can be accelerated and, at the same time, the waveform distortion of the gate voltages (Vg1, Vg2) after supplying of electricity can be prevented and hence, the level converting circuit which can respond rapidly at the time of supplying electricity with small jitter can be realized.

Figure 12:
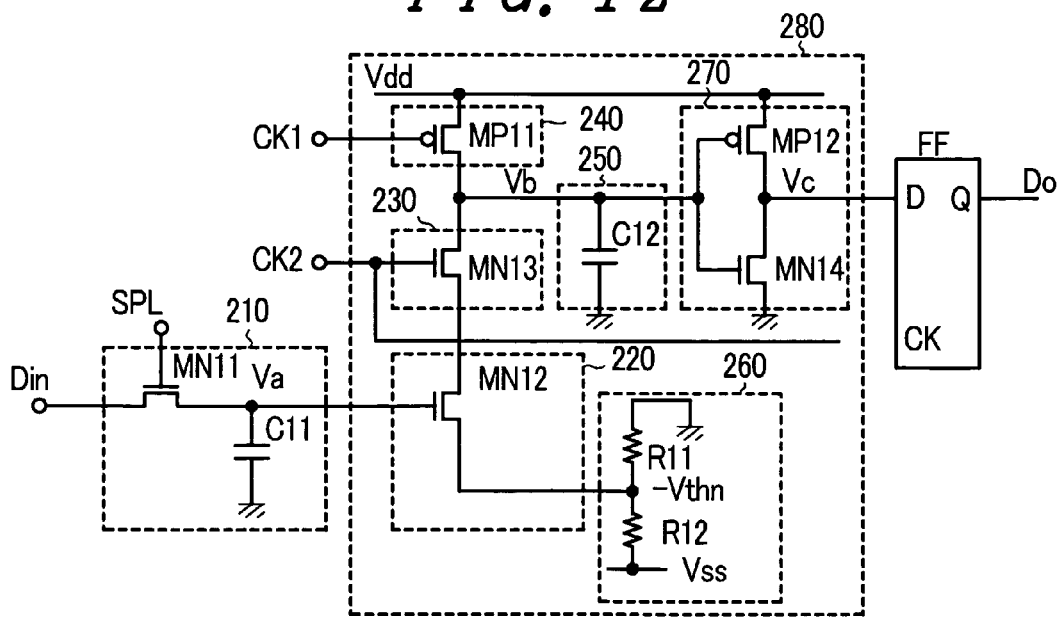
FIG. 12 is a circuit diagram showing the circuit constitution of a sample holding circuit shown in FIG. 1 and an example of a direct-coupled type level converting circuit.

FIG. 12 is a circuit diagram showing a circuit constitution of one example of a sample holding circuit 200 and a direct-coupled-type level converting circuit 300 shown in FIG. 1.

The sample holding circuit 210 is constituted by an NMOS (MN11) and a capacitive element (C11).

In the NMOS (MN11), a drain is connected to the node (Va), a display data (Din) is applied to the source and a sampling pulse (SPL) is applied to a gate.

The capacitive element (C11) is connected between the node (Va) and a ground voltage (GND).

A direct-coupled type level converting circuit 280 is constituted by a V/I converting circuit 220, a second switching element 230, a first switching element 240, a voltage holding circuit 250, a third bias circuit 260 and an inverter 270.

The V/I converting circuit 220 is constituted by an NMOS (MN12) and the NMOS (MN12) has a gate thereof connected to the node (Va), a source thereof connected to the third bias circuit 260 and a drain thereof connected to the second switching element 230.

The second switching element 230 is constituted by an NMOS (MN13) and the NMOS (MN13) has a source thereof connected to the V/I converting circuit 220 and a drain thereof connected to the node (Vb). Further, a signal (CK2) is applied to a gate of the NMOS (MN13).

The first switching element is constituted by a PMOS (MP11) and, in the PMOS (MP11), a drain is connected to the node (Vb) and, at the same time, the power source voltage (Vdd) is applied to a source and a signal (CK1) is applied to a gate.

The voltage holding circuit 250 is constituted by a capacitive element (C12) which is connected between the node Vb and the ground voltage (GND).

The third bias circuit 260 is constituted by a resistance element (R11) and a resistance element (R12) and the source of the NMOS (MN12) is connected to a connection point (potential dividing point) between the resistance element (R11) and the resistance element (R12).

The inverter 270 is constituted by a PMOS (MP12) and a NMOS (MN14), wherein the voltage of the node (Vb) is inputted to the inverter 270 and the output voltage (Vc) is inputted to the D type flip-flop circuit (FF).

Figure 13:
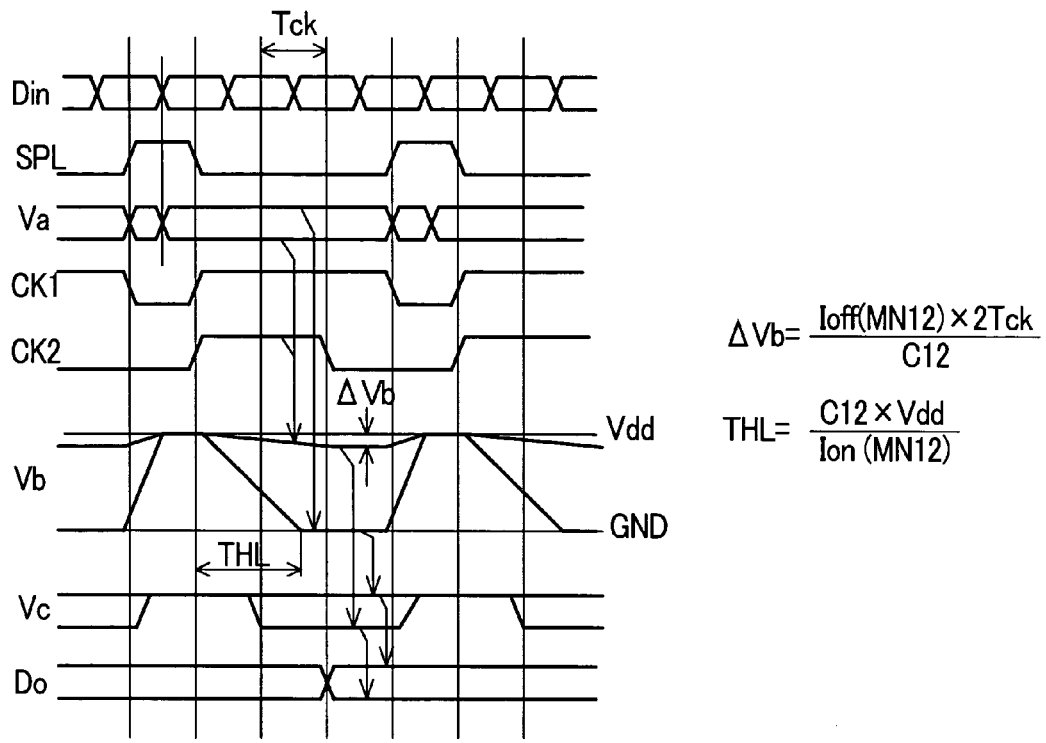
FIG. 13 is a view showing voltage waveforms of respective portions in FIG. 12.

FIG. 13 is a view showing voltage waveforms of the respective portions shown in FIG. 12.

Din indicates display data having a small amplitude and a cycle thereof is Tck. SPL indicates a sampling pulse and the cycle thereof is 4×Tck.

The sample holding circuit 210 samples the display data (Din) when the sampling pulse (SPL) is at the H level and holds the display data when the sampling pulse (SPL) falls.

The signal (CK1) is a control signal of the first switching element 240, while the signal (CK2) is a control signal of the second switching element 230.

When the signal (CK1) assumes the L level and the PMOS (MP11) is turned on, the capacitive element (C12) is charged and the voltage of the node (Vb) assumes Vdd.

Next, when both of the signal (CK1) and the signal (CK2) assume the H level, the PMOS (MP11) is turned off and the NMOS (MN13) is turned on.

Here, when the node (Va) is at the L level, the NMOS (MN12) is turned off and an OFF current flows into the NMOS (MN12) and hence, the voltage value of the node (Vb) becomes lower than Vdd by ΔVb.

On the other hand, when the node (Va) is at the H level, the NMOS (MN12) is turned on and an ON current flows into the NMOS (MN12) and hence, the voltage value of the node (Vb) assumes GND after a lapse of a period THL.

The voltage at the node (Vb) receives the waveform shaping at the inverter 270 and is formed into an output voltage (Vc).

As explained hereinabove, in the circuit shown in FIG. 12, the small amplitude display data (Din) can be converted into the signal (Vc) having the amplitude of Vdd.

When the node (Va) is at the L level, the change of voltage ΔVb of the node (Vb) is expressed by the following formula (5).

$$\Delta Vb = Ioff(MN12) \times 2Tck/C12 \quad (5)$$

On the other hand, when the node (Va) is at the H level, the time THL that the node (Vb) requires to reach GND is expressed by the following formula (6).

$$THL = C12 \times Vdd/Ion(MN12) \quad (6)$$

Since it is desirable that both of ΔVb and THL are small, an operation point of the NMOS (MN12) is set such that the OFF current Ioff (MN12) is small and the ON current Ion (MN12) is large.

Accordingly, to allow the voltage between the gate and the source to assume the threshold voltage when the gate voltage of the NMOS (MN12) is the minimum value, the output voltage of the third bias circuit 260 is set to (−Vthn).

Due to such setting of voltages, as viewed from the source of the NMOS (MN12), the gate voltage assumes a voltage corresponding to the threshold value (Vthn) of the transistor (MN12) and a voltage which is further higher than the threshold value (Vthn) by an amount corresponding to an amplitude of the display data (Din) and hence, the NMOS (MN12) is turned on/off based on these voltages.

Due to such setting of voltages, in a state that the OFF current of the NMOS (MN12) is suppressed, the ON current can be increased.

Figure 14:
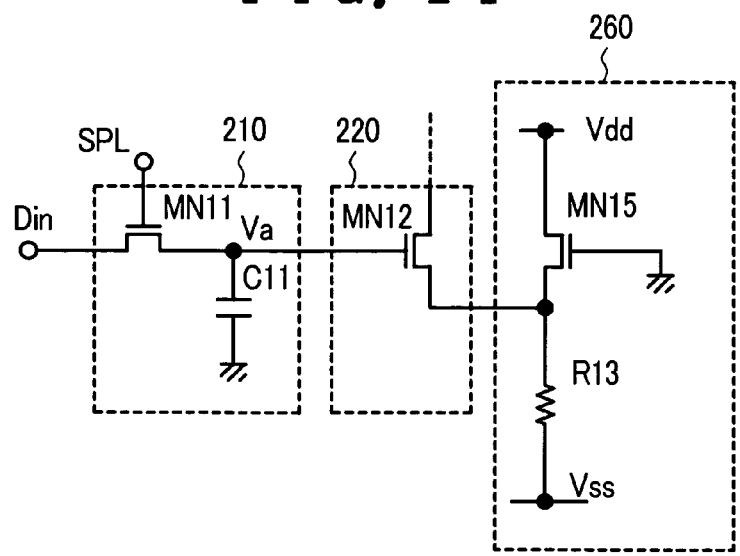
FIG. 14 is a circuit diagram showing the circuit constitution of another example of a bias circuit shown in FIG. 12.

FIG. 14 is a circuit diagram showing another example of the circuit constitution of the bias circuit 260 shown in FIG. 12.

The bias circuit shown in FIG. 14 is constituted by a MOS transistor NMOS (MN15) and a resistance element (R13).

In the NMOS (MN15), a source is connected to the resistance element (R13). Further, a ground voltage (GND) is applied to a gate and a power source voltage (Vdd) is applied to a drain.

The NMOS (MN15) is operated as a source follower and the source voltage which constitutes an output assumes (−Vthn).

In the bias circuit shown in FIG. 14, the current when the NMOS (MN12) is turned on is limited by the resistance element (R13).

Accordingly, it is necessary that the resistance element (R13) is set to a sufficiently small value, at the same time, the ON current of the NMOS (MN15) is increased.

Figure 15:
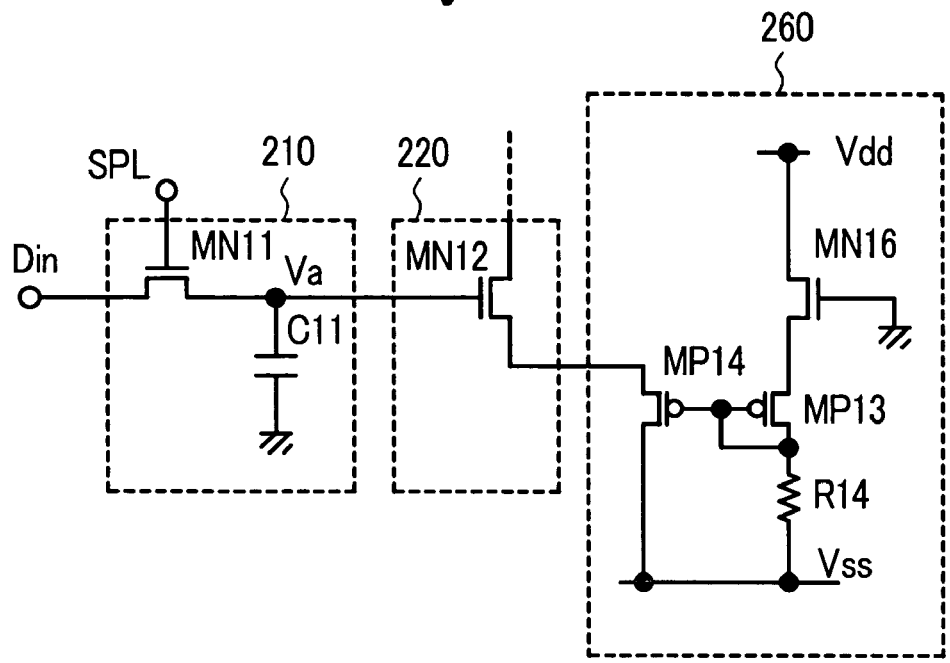
FIG. 15 is a circuit diagram showing the circuit constitution of another example of a bias circuit shown in FIG. 12.

FIG. 15 is a circuit diagram showing another example of the circuit constitution of the bias circuit 260 shown in FIG. 12.

The bias circuit shown in FIG. 15 is constituted by an NMOS (MN16), a PMOS (MP13), a PMOS (MP14) and a resistance element (R14).

In the NMOS (MN16), the ground voltage (GND) is applied to a gate and the power source voltage (Vdd) is applied to a drain.

The PMOS (MP13) is connected in diode connection and has a source thereof connected to a source of the NMOS (MN16) and a drain thereof connected to a resistance element (R14).

In the PMOS (MP14), a gate is connected to a gate of the PMOS (MP13) and the source is connected to the source of the NMOS (MN12) and a negative power source voltage (Vss) is applied to the drain.

Due to such a circuit constitution, the source voltage (Vsn12) of the NMOS (MN12) is expressed by the following formula (7).

$$Vsn12 = -(Vthn16 + Vthp13) + Vthp14 \quad (7)$$

Assuming a threshold voltage of the PMOS as Vthp and a threshold voltage of the NMOS as Vthn, the source voltage of the NMOS (MN12) becomes −Vthn and hence, the same bias voltage as the bias circuit shown in FIG. 14 can be obtained.

Although the current when the NMOS (MN12) is turned on is limited by the dynamic resistance of the source of the PMOS (MP14), the dynamic resistance is decreased corresponding to the increase of the current and hence, the influence of the dynamic resistance is small.

Figure 16:
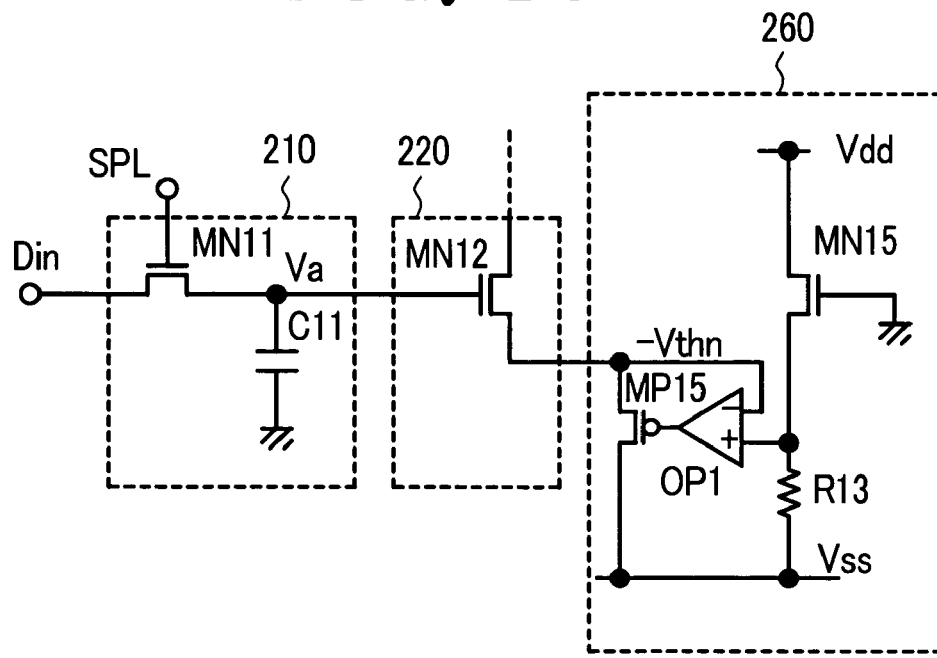
FIG. 16 is a circuit diagram showing the circuit constitution of another example of a bias circuit shown in FIG. 12.

FIG. 16 is a circuit diagram showing another example of the circuit constitution of the bias circuit 260 shown in FIG. 12.

The bias circuit shown in FIG. 16 is constituted by adding an operational amplifier (OP1) and a PMOS (MP15) to the bias circuit shown in FIG. 14.

With the use of the operational amplifier (OP1) and the PMOS (MP15), the source voltage of the NMOS (MN12) is controlled in a negative feedback manner and hence, the source of the NMOS (MN12) can be operated at low impedance.

Figure 17:
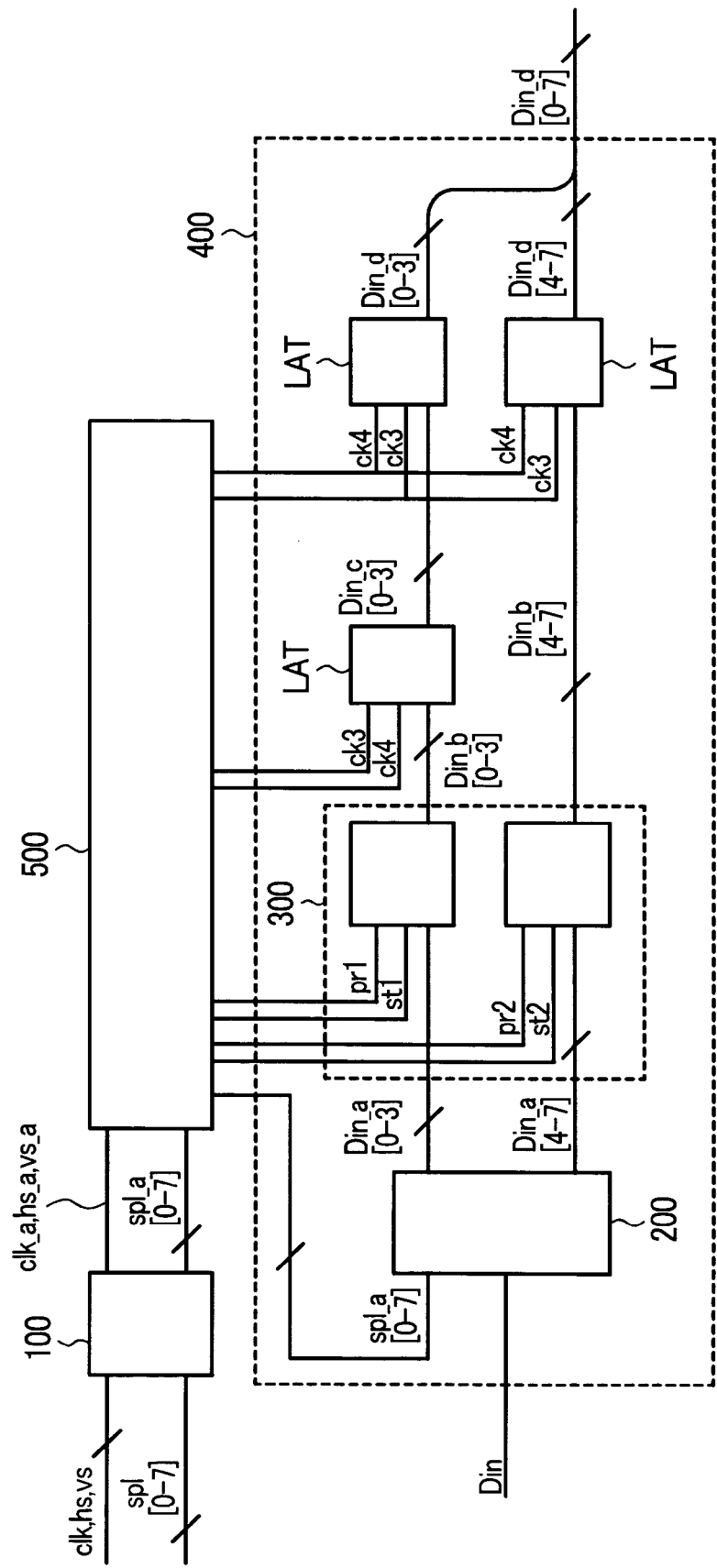
FIG. 17 is a block diagram showing the circuit constitution of a display data inputting circuit which uses the capacitive coupling type level converting circuit, the sample holding circuit and the direct-coupled type level converting circuit of this embodiment.

FIG. 17 is a block diagram showing the circuit constitution of a display data input circuit using a capacitive coupling type level converting circuit, a sample holding circuit and a direct-coupled type level converting circuit according to the embodiment.

The display data input circuit shown in FIG. 17 is constituted by a capacitive coupling type level converting circuit 100, a sample holding circuit 200, a direct-coupled type level converting circuit 300, a serial-parallel converting circuit 400 and a timing control circuit 500.

Here, the sample holding circuit 200 and the direct-coupled type level converting circuit 300 constitute a part of the serial-parallel converting circuit 400.

In the capacitive coupling type level converting circuit 100, a plurality of capacitive coupling type level converting circuits shown in the above-mentioned FIG. 2, FIG. 4, FIG. 6, FIG. 8, FIG. 10 or FIG. 11 are used.

By using this capacitive coupling type level converting circuit 100, voltage levels of a clock (clk), a horizontal synchronous signal (hs), a vertical synchronous signal (vs) and eight sampling signals (spl) can be converted. The signals after level conversion are indicated respectively as clk_a, hs_a, vs_a, spl_a.

Figure 18:
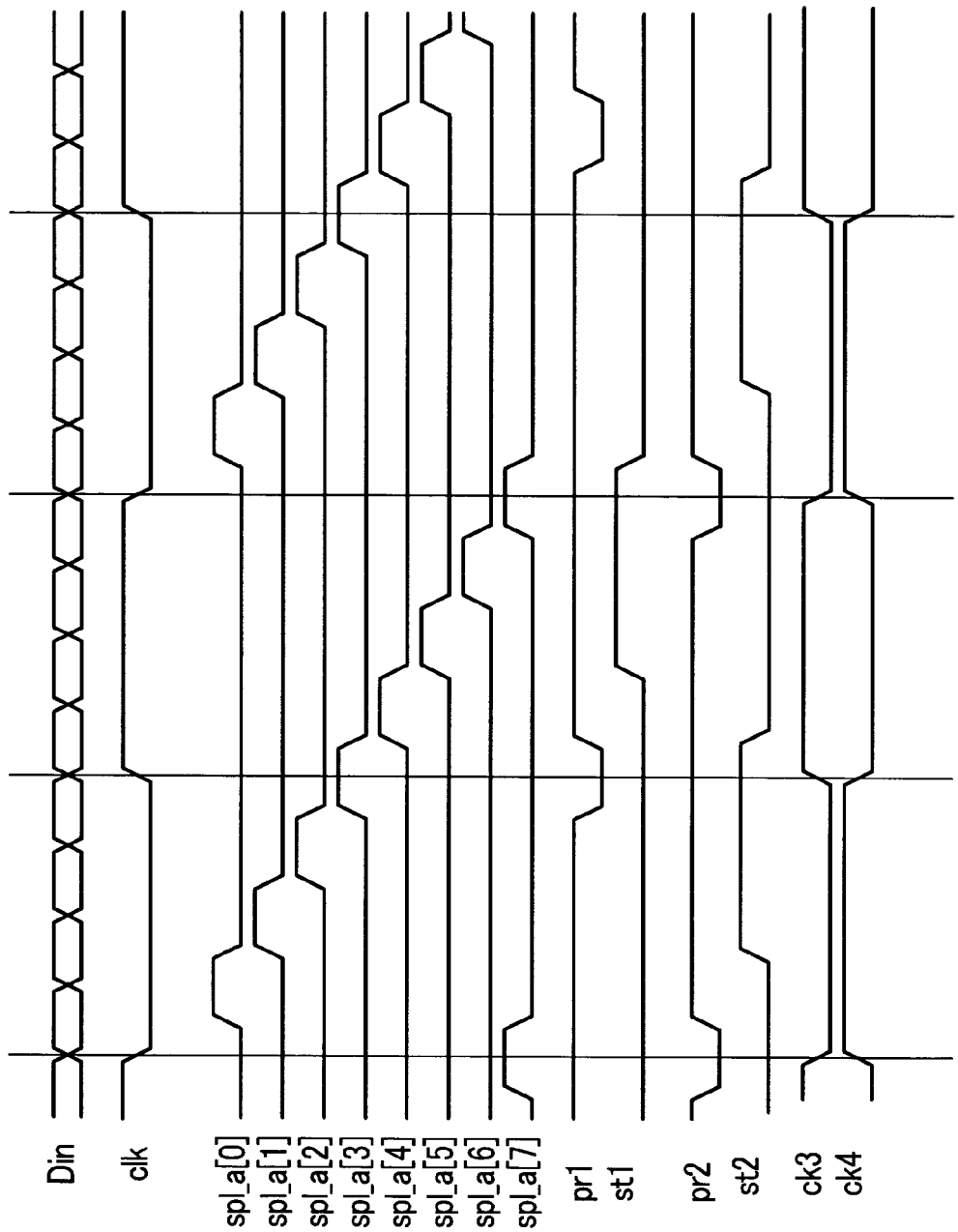
FIG. 18 is a view showing a timing chart of some signals shown in FIG. 17.

The sample holding circuit 200 is constituted by connecting eight sample holding circuits shown in the above-mentioned FIG. 12 in parallel and samples the display data (Din) inputted in series as eight level-converted sampling signals (spl_a) which are shown in FIG. 18. Here, the respective spl_a correspond to the sampling pulses (SPL) in FIG. 13 or the like.

Further, FIG. 18 shows a timing chart of some signals shown in FIG. 17.

In the direct-coupled type level converting circuit 300, the level converting circuit 280 as shown in FIG. 12 is arranged such that the level converting circuit 280 is divided into two systems each of which consists of four circuits and the respective level converting circuits 280 convert the levels of the voltages (Din_a) which are sampled at different timings. Here, instead of the circuit shown in FIG. 12, the circuits shown in FIG. 14, FIG. 15 or FIG. 16 may be used.

In the serial parallel converting circuit 400, three out of four input latch circuits (LAT) are used. With the use of these latch circuits (LAT), the timing of the display data (Din_b, Din_c) whose levels are converted at the different timings are made agree to each other and are converted in parallel and are outputted as Din_d.

The timing control circuit 500 generates control signals (ck3, ck4, pr1, pr2, st1, st2) based on the clock (clk_a) and the synchronous signals (hs_a, vs_a) which are subjected to the level conversion. Here, the control signals pr1 and pr2 correspond to the signal (CK1) in FIG. 13 or the like and the signals st1 and st2 correspond to the signal (CK2) in FIG. 13 or the like.

As has been explained heretofore, in the capacitive coupling type level converting circuit of this embodiment, with respect to the first bias circuit 110 and the second bias circuit 120, the gate voltages in the OFF state of the PMOS (MP1) and the NMOS (MN1) are controlled to the voltages substantially equal to the threshold voltages of the PMOS (MP1) and the NMOS (MN1) and hence, the OFF current can be suppressed and the power consumption can be reduced.

Further, in the first bias circuit 110 and the second bias circuit 120, the bias voltages are respectively determined based on the thresholds voltages (Vth) of the PMOS and the NMOS and hence, the OFF state can be stably held without depending on the fluctuation (variation) of the threshold voltages (Vth).

Further, the gate voltages in the ON state are voltages in which the voltage amplitude of the input signals are added to the threshold voltages of the PMOS (MP1) and the NMOS (MN1) and the ON current can be increased, a level converting circuit having a high operational frequency can be realized even when the input signal has a small amplitude.

By this means, the level conversion can be performed even at the input voltage lower than the threshold voltages (Vth) of the PMOS (MP1) and the NMOS (MN1).

Accordingly, in the capacitive coupling type level converting circuit according to this embodiment, it is possible to perform the level conversion of the input signals having an amplitude of 1.2V or less, for example, the input signal having an amplitude smaller than a twofold value of the threshold voltages of the PMOS (MP1) and the NMOS (MN1) formed of thin film transistor.

In this case, to further reduce the power consumption, it is preferable that the input signal is a signal having an amplitude equal or less than 1.6 times of the threshold voltages of the PMOS (MP1) and the NMOS (MN1).

Theoretically, it is possible to perform the level conversion on the input signal having an amplitude equal to or less than the threshold voltage. However, to perform the rapid level conversion, the input signal is favorably a signal having an amplitude equal to or more than the threshold voltages as well as equal to or lower than 1.6 times of the threshold voltages of the PMOS (MP1) and the NMOS (MN1).

In the direct-coupled type level converting circuit of this embodiment; With the use of the third bias circuit, the voltages between the gate and the source of the NMOS (MN12) which constitutes the V/I converting circuit can be set to a value substantially equal to the threshold voltage (Vth) of the NMOS (MN12). Further, in the ON state, the voltage which is obtained by adding the voltage amplitude of the input signal to this threshold voltage (Vth) is applied and hence, it is possible to set a sufficiently high ON/OFF ratio whereby a level converting circuit capable of performing the level conversion of the display data with small amplitude and high speed can be realized.

Further, by realizing the level converting circuits for synchronous signals and display data using the capacitive coupling type level converting circuit and the direct-coupled type level converting circuit respectively, a signal level converting circuit for a display device which can perform the level conversion of the signals having a small amplitude at a high speed can be realized.

Accordingly, in the display device of this embodiment, since the high speed interface signals of the display device and system LSI can be obtained, the number of terminals of the signal lines can be reduced and the cost can be reduced and, at the same time, the display device having high reliability can be realized.

Further, in combination with the serial parallel conversion of the display data, the higher processing speed can be achieved and the number of terminals of the signal lines can be substantially decreased.

Further, since the interface signals between the display device and the system LSI can have the small amplitude, the signal from the system LSI which is operated at a low voltage can be inputted directly into the display device and hence, the number of components can be reduced and the power consumption can be reduced.

Here, in the foregoing explanation, the present invention is explained with respect to the embodiments which are applied to the liquid crystal display module, however, it is needless to say that the present invention is not limited to the liquid crystal display module and the present invention is applicable to other display devices such as an EL display device or the like.

Further, this embodiment is not limited to the case in which the biasing of voltage is performed only with respect to a value substantially equal to the threshold voltage of the transistor and the biasing of voltage may be performed within a range higher than the half of the threshold voltage and lower than the threshold voltage.

As described above, although the inventions which are made by the inventors have been specifically explained in conjunction with the above-mentioned embodiments, it is obvious that the present invention is not limited to the above-mentioned embodiments and various modification can be made without departing from the scope of the invention.

To briefly explain the advantageous effects obtained by typical inventions out of the inventions disclosed in this specification, they are as follows.

(1) According to the present invention, since the high speed interface signals are ensured between the display device and system LSI, the number of terminals of the signal lines can be reduced and the cost can be cut and, at the same time, the display device having the high reliability can be realized.

(2) According to the present invention, the interface signals between the display device and the system LSI having small amplitude can be obtained. Accordingly, the signal from the system LSI which is operated in a low voltage can be inputted directly to the display device and hence, the number of components can be reduced and the power consumption can be reduced.

What is claimed is:

1. A display device having a level converting circuit which converts input signals having a small amplitude into signals having a larger amplitude,
   wherein the level converting circuit comprises:
   a sample-hold circuit which samples the input signals;
   a transistor comprising a gate electrode to which an output voltage of the sample-hold circuit is inputted;
   a first switching element of which a first electrode is connected to a first power line supplying a first power source voltage;
   a second switching element of which a first electrode is connected to a second electrode of the first switching element, and of which a second electrode is connected to a second electrode of the transistor;
   a voltage holding circuit connected to the first electrode of the second switching element;
   an inverter circuit connected to the first power line and a second power line which supplies a second power source voltage, and to which an output voltage from the voltage holding circuit is inputted; and
   a bias circuit connected to the second power line, and which provides a bias voltage to a first electrode of the transistor, the bias voltage decreasing a threshold voltage of the transistor.

2. A display device according to claim 1, wherein the input signals are signals which have an amplitude smaller than a twofold value of the threshold voltage of the transistor.

3. A display device according to claim 2, wherein the input signals are signals which have an amplitude equal to or more than the threshold voltage of the transistor and equal to or less than 1.6 times the threshold voltage of the transistor.

4. A display device according to claim 2, wherein the input signals are signals which have an amplitude equal to or less than 1.6 times the threshold voltage of the transistor.

5. A display device according to claim 1, wherein the input signals are either control signals or display data.

6. A display device according to claim 1, wherein the level converting circuit converts input signals having an amplitude of 1.2V or less into signals having a larger amplitude.

* * * * *

UNITED STATES PATENT AND TRADEMARK OFFICE
CERTIFICATE OF CORRECTION

PATENT NO.      : 7,623,109 B2
APPLICATION NO. : 11/514841
DATED           : November 24, 2009
INVENTOR(S)     : Sato et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 655 days.

Signed and Sealed this

Twenty-sixth Day of October, 2010

David J. Kappos
*Director of the United States Patent and Trademark Office*